United States Patent
Miyamoto

[11] Patent Number: 5,846,331
[45] Date of Patent: Dec. 8, 1998

[54] PLASMA PROCESSING APPARATUS

[75] Inventor: Hidenobu Miyamoto, Tokyo, Japan

[73] Assignee: NEC Corporation, Tokyo, Japan

[21] Appl. No.: 838,533

[22] Filed: Apr. 9, 1997

[30] Foreign Application Priority Data

Apr. 25, 1996 [JP] Japan .................................. 8-105213

[51] Int. Cl.⁶ ............................................ C23C 16/00
[52] U.S. Cl. .................................. 118/723 R; 118/723 I; 156/345; 315/111.51
[58] Field of Search ........................... 118/723 I, 723 IR, 118/723 AN, 723 R, 723 E; 156/345; 204/298.02, 298.08, 298.09, 298.31, 298.34; 315/111.51

[56] References Cited

U.S. PATENT DOCUMENTS

| | | | |
|---|---|---|---|
| 3,706,635 | 12/1972 | Kowalski | 204/46 |
| 3,843,232 | 10/1974 | Berets | 350/160 |
| 4,119,760 | 10/1978 | Rinehart | 428/410 |
| 4,573,768 | 3/1986 | Polak et al. | 350/357 |
| 4,948,458 | 8/1990 | Ogle | 156/643 |
| 5,455,138 | 10/1995 | Okamura et al. | 430/128 |
| 5,472,564 | 12/1995 | Nakamura et al. | 216/51 |
| 5,477,975 | 12/1995 | Rice et al. | 216/68 |
| 5,550,352 | 8/1996 | Geeroms | 219/497 |
| 5,587,038 | 12/1996 | Cecchi et al. | 156/345 |
| 5,626,751 | 5/1997 | Kikuchi et al. | 210/321.75 |

FOREIGN PATENT DOCUMENTS 6232081 8/1994 Japan .

Primary Examiner—R. Bruce Breneman
Assistant Examiner—Luz Alejandro
Attorney, Agent, or Firm—Whitham, Curtis & Whitham

[57] ABSTRACT

A dielectric member is provided at the upper portion of a grounded vacuum reaction vessel. Other portion of the vacuum reaction vessel is grounded. A flow path is formed within the dielectric member. The flow path is covered with a conductive member and an insulation member. The conductive member is grounded at the same voltage as the vacuum reaction vessel. Also, a temperature measuring element is buried within the dielectric member. The temperature measured by the temperature measuring element is fed back so that the temperature of the hot insulation medium is controlled. Thus, the temperature of the dielectric member is maintained constant within a range of 60° to 160° C.

17 Claims, 11 Drawing Sheets

PLASMA PROCESSING APPARATUS

BACKGROUND OF THE INVENTION

1. Field of the Invention

The present invention relates generally to a plasma processing apparatus to be employed in fabrication of a semiconductor device. More specifically, the invention relates to a plasma processing apparatus for etching a surface of a wafer as a semiconductor substrate.

2. Description of the Art

Associating with increasing of package density of semiconductor devices, down-sizing of a pattern to be formed on a semiconductor substrate is progressively required. In order to form such a fine pattern, a plasma processing apparatus is employed as a dry etching apparatus. In the dry etching apparatus, a plasma is generated within a vacuum vessel and neutral radicals and ions in the plasma are injected for etching the fine pattern. By enhancing etching rate in vertical direction called as anisotropy, finer pattern can be formed. In order to enhance the anisotropy, it is effective to set longer mean free path to increase straightness of ion to be injected on the substrate.

In order to increase straightness of the ion, it may be effective to reduce frequency of collision of the ion with neutral radicals by reducing number of the neutral particle by lowering pressure in the reaction vessel. However, in this case, density of the plasma per se can also be lowered to result in other problems of, for example, lowering of etching speed and lowering of selectivity in relation to the base. In order to solve those problems, there has been proposed a plasma processing apparatus which can generate sufficient density of plasma under low pressure employing a high density plasma source (Japanese Unexamined Patent Publication No. Hei 6-232081). FIG. 1 is a diagrammatic section showing one example of the conventional plasma processing apparatus. As shown in FIG. 1, in the plasma processing apparatus, there are arranged a conductive vacuum vessel 19 provided with a dielectric member 18 at the upper portion thereof, the other portion being grounded, an RF antenna 17 arranged outside of the vacuum vessel 19 and located at the upper surface of the dielectric member 18 via a conductive member 16, a high frequency power source 9a supplying a high frequency current to the RF antenna 17 via a tuning member 11a, a lower electrode 7 provided at the lower part of the vacuum vessel 19 via an insulation member 20 and mounting a work 21 thereon, and another high frequency power source 9b applying a high frequency voltage to the lower electrode 7 via a tuning member 11b.

In the conventional plasma processing apparatus, an induced electric field generated by electromagnetic induction of the RF antenna 17 is introduced into the interior of the vacuum vessel 19 for generating a high density plasma within the vacuum vessel 19. In this method, it becomes possible to improve etching speed and to avoid lowering of selectivity in relation to the base. Also, in this kind of apparatus, it is likely to cause sputtering to the dielectric member 18 due to capacitive coupling between the RF antenna 17 and the plasma to discharge impurity from the dielectric member 18. In the prior art set forth above, a conductive member 16, which has a function of permeability of the induced electric field, is provided between the RF antenna 17 and the dielectric member 18. Since the conductive member 16 is electrically grounded by connection with the vacuum vessel 19, it becomes possible to prevent the direct coupling between the RF antenna 17 and plasma. Therefore, a component of the capacitive coupling in the plasma can be reduced to successfully prevent admixing of impurity into the plasma due to sputtering to the dielectric member 18.

In the conventional plasma processing apparatus set forth above, while discharge of impurity due to sputtering can be successfully prevented, it is not possible to avoid deposition of the reaction product to the dielectric member 18 during etching. The deposition films are formed with the reaction product with every process, and peeled off eventually. At this time, the reaction product is deposited on the wafer as the substrate in a form of particle to contaminate the wafer. Therefore, critical degradation of quality happens to the semiconductor device fabricated from the contaminated wafer.

On the other hand, since surface temperature of the dielectric member 18 is risen according to elapsing in the etching process and increasing of number of substrates to be continuously processes, the deposition amount to the dielectric member 18 is reduced. However, there is a demerit that the deposition amount to the wafer may be increased in the extent that variation of etching configuration to degrade reproducibility.

Also, while a method of fixing the RF antenna 17 and the conductive member 16 located away from the dielectric member 18, even when they are fixed mechanically, a variation of relative position to the dielectric member 18 should be caused due to vibration, mechanical impact or so forth according to elapsing. As a result, the plasma density becomes non-uniform to cause a variation of etching and thus to cause degradation of reproducibility.

SUMMARY OF THE INVENTION

Therefore, it is an object of the present invention to provide a plasma processing apparatus for restricting sputtering to a dielectric member and deposition on the surface of the dielectric member and thereby preventing contamination of work, and which can etch with high reproducibility and stability. A plasma processing apparatus, according to the present invention, includes a vacuum reaction vessel having a dielectric member at the upper portion thereof, the other portion being electrically grounded. A high frequency coil is provided outside of the vacuum reaction vessel at the upper surface of the dielectric member. To the high frequency coil, a first high frequency power source supplying a high frequency current is connected. Between the high frequency coil and the first high frequency source, a first tuning member is connected. The plasma processing apparatus also includes means for introducing a plurality of process gas into the vacuum reaction vessel. At the lower part of the vacuum reaction vessel, a lower electrode is positioned, on which a work to be processed is mounted. To the lower electrode, a second high frequency power source applying a high frequency voltage is connected. Between the lower electrode and the second high frequency power source, a second tuning member is connected. A hot medium circulating device having a plurality of flow paths through which a hot medium is circulated within the dielectric member and located outside of the vacuum reaction vessel, is provided. The hot medium or the flow paths are connected to the ground. Also, a temperature adjusting member for controlling temperature of the hot medium and the dielectric member is provided.

In the plasma processing apparatus, the hot medium may be conductive and the electrically grounding means may connect a conductive piping in the flow paths to ground.

In the plasma processing apparatus, the hot medium may be electrically insulated and the electrically grounding means may have conductive member provided at the inner wall of the flow paths and grounded.

In the plasma processing apparatus, the conductive member is preferably covered with an insulation member.

In the plasma processing apparatus, the flow paths preferably comprise of a plurality of flow paths in coaxial circular form at the center portion of the dielectric member.

In the plasma processing apparatus, a projection area of the flow paths becomes smaller at greater distance from the center portion of the dielectric member to the outer periphery.

In the plasma processing apparatus, the temperature of the dielectric member may be appropriately controlled within a range between 60° to 160° C.

In the plasma processing apparatus, the temperature adjusting member may have a fluorescent thermometer buried within the dielectric member and connected to a control portion and the temperature measured by the fluorescent thermometer may be fed back to the control portion to control the temperature of the dielectric member.

In the plasma processing apparatus, the hot conductive medium may be a solution selected from a group comprising of an acid solution with high ion concentration and alkaline solution with high ion concentration.

In the plasma processing apparatus, the hot insulation medium may be a liquid selected from a group comprising of hot fluorocarbon type medium and pure water.

In the present invention, a dielectric member mounting the high frequency coil is provided with the flow paths within itself. Since the flow paths or the hot medium flowing through flow paths are arranged at the same potential as the vacuum reaction vessel, the capacitive coupling between the high frequency coil and the plasma in the vacuum reaction vessel can be lowered to successfully prevent contamination of the plasma by the impurity generated by sputtering to the surface of the dielectric member. Also, since the temperature of the dielectric member is controlled to be constant at the desired one, it is also possible to prevent contamination of the work due to peeling off of the reaction product depositing on the surface of the dielectric member, and permit continuous etching process with reproducibility and stability.

BRIEF DESCRIPTION OF THE DRAWINGS

The present invention will be understood more fully from the detailed description given hereinafter and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however to those skilled in the art that the present invention may be practiced without these specific details. In other instance, well-known structures are not shown in detail in order to avoid unnecessary obscure the present invention.

Figure 1:
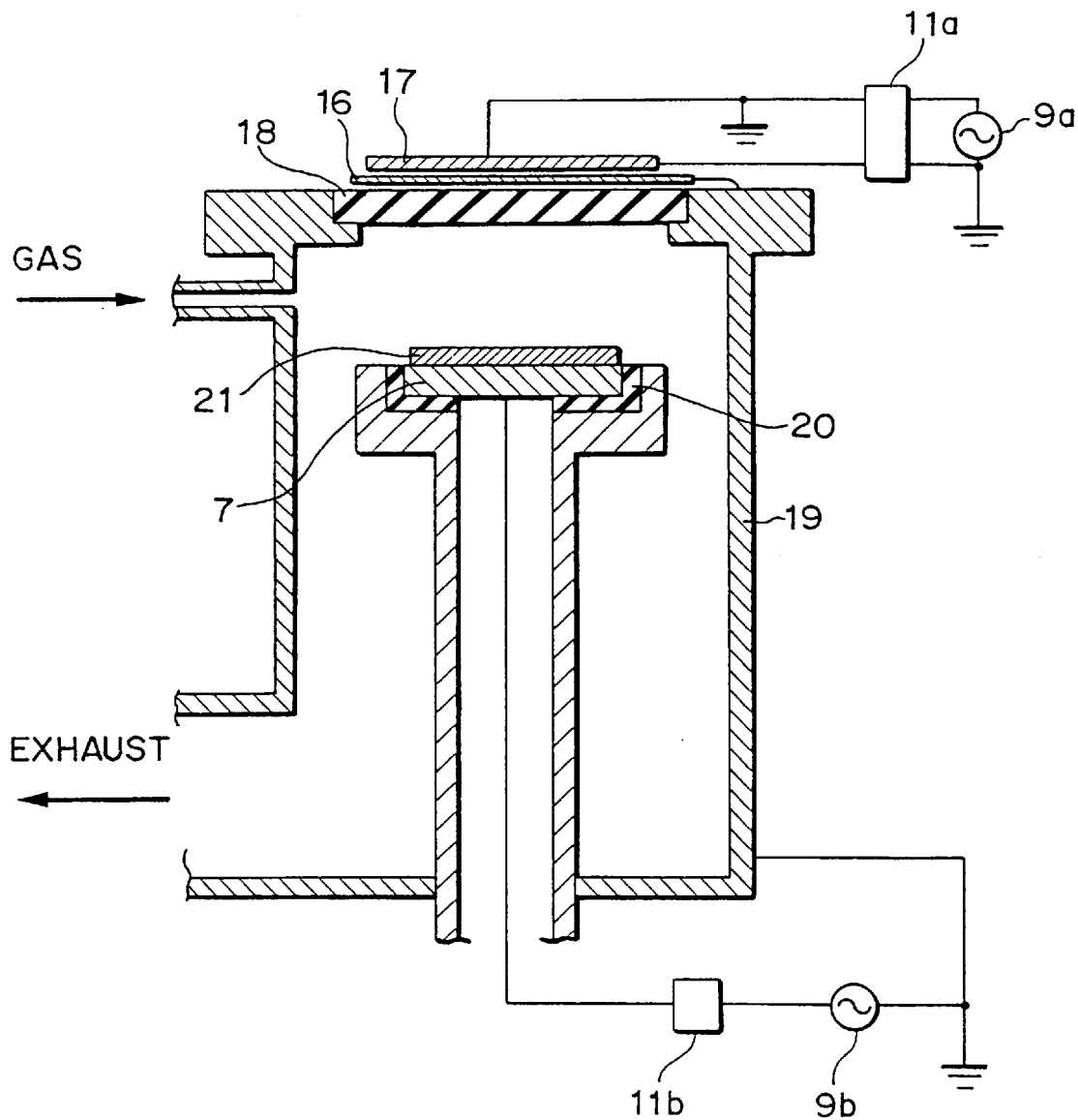
FIG. 1 is a diagrammatic section showing one example of the conventional plasma processing apparatus.
Figure 2:
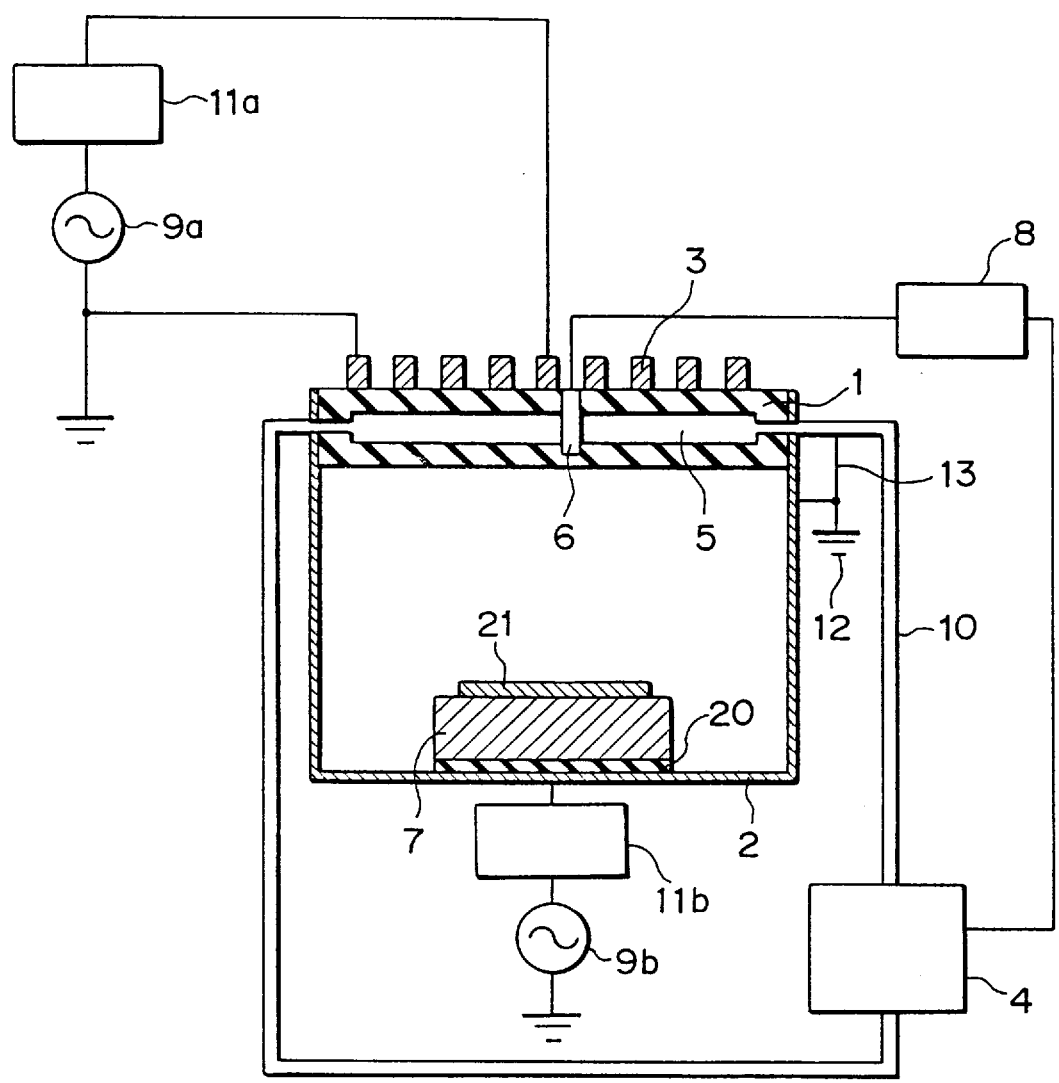
FIG. 2 is a diagrammatic section showing the first embodiment of a plasma processing apparatus according to the present invention.

FIG. 2 is a diagrammatic section showing the first embodiment of a plasma processing apparatus according to the present invention. The first embodiment of the plasma processing apparatus according to the present invention is provided with a vacuum reaction vessel 2 grounding via a ground 12, a dielectric member 1 forming an upper wall portion of the vacuum reaction vessel 2, a flow path 5 through which a hot conductive medium flows provided within the dielectric member 1, a circulator 4 circulating the hot medium through a conductive piping 10, a conductive line 13 connected to the ground 12 for grounding the hot conductive medium via the conductive piping 10, a high frequency coil 3 arranged outside of the vacuum reaction vessel 2 in contact with the upper surface of the dielectric member 1, a temperature measuring element 6 buried within the dielectric member 1 for measuring temperature thereof, and a control portion 8 connected to the temperature measuring element 6 maintaining the temperature of the dielectric member 1 at desired one by controlling the temperature of the hot medium.

Furthermore, a high frequency power source 9a supplying a high frequency current to a high frequency coil 3 via a tuning member 11a, a lower electrode 7 mounting a work 21 thereon provided at the lower part of the vacuum reaction vessel 2 via an insulation member 20 and a high frequency power source 9b applying a high frequency voltage to the lower electrode 7 via a tuning member 11b are provided similarly to the prior art. Also, while not illustrated in the drawing, the apparatus is provided with a gas introducing port for introducing a process gas and an exhauster for controlling pressure of the process gas introduced into the vacuum reaction vessel 2.

In the first embodiment, an induced electric field is formed within the vacuum reaction vessel 2 via the dielectric member 1 by supplying the high frequency current to the high frequency coil 3. Thus, a plasma is generated within the vacuum reaction vessel 2. In the prior art, the high frequency coil 3 also serves as an electrode. As a result, the high frequency coil 3 and the plasma are capacitively coupled. When the capacitive coupling is large, a sheath voltage to be applied on the surface of the dielectric member 1 becomes high to cause sputtering to the dielectric member 1 to discharge impurity into the plasma therefrom.

On the other hand, in the first embodiment, the hot medium to be flown through the flow path 5 within the dielectric member 1 is conductive liquid, and the conductive piping 10 connected to the flow path 5 is connected to the ground 12 via the conductive line 13. Therefore, the hot medium can be grounded to reduce the capacitive coupling. Thus, contamination of the plasma by the impurity can be successfully prevented. Also, the hot medium acts as heat medium and maintains the temperature of the dielectric member 1 at desired one. Therefore, rising of temperature of the dielectric member 1 due to deposition, which can be a cause of generation of particles, can be suppressed to etch with high stability and reproducibility. On the other hand, an electromagnetic shielding mechanism constructed with the hot conductive medium and the flow path 5 are integrated with the dielectric member 1. Thus, the problem to cause variation of the relative position according to elapsing due to vibration and impact, can be avoided.

Figure 3:
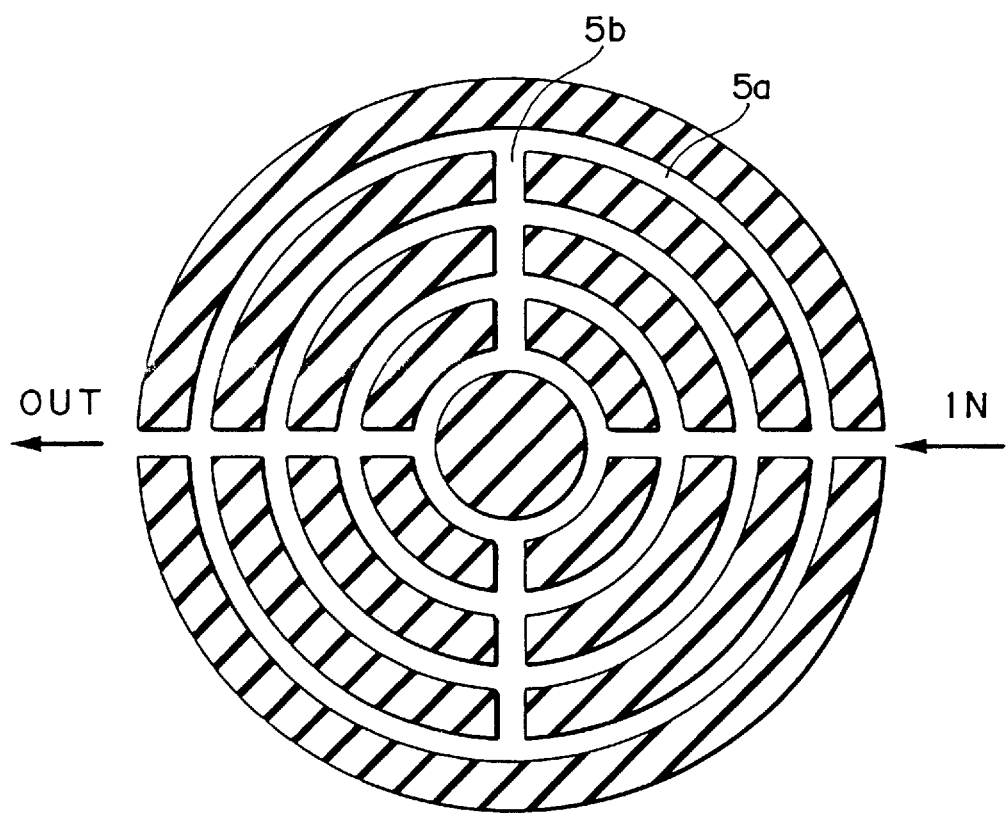
FIG. 3 is a cross section of a dielectric member 1 shown in FIG. 2.

FIG. 3 is a cross section of the dielectric member 1 shown in FIG. 2. As shown in FIG. 3, in the cross section, the flow path is primarily constructed with a plurality of concentrically arranged circular flow paths 5a within a circular dielectric member 1 in the cross section. Furthermore, a plurality of flow paths 5b are extended radially from the center and intersecting with the circular flow paths 5a. Number of the flow paths 5b is desired to be designed so that a variation of temperature may not be caused in the dielectric member 1 depending upon size of the dielectric member 1. On the other hand, temperature of the hot medium and the dielectric member 1 is measured by the temperature measuring element 6, such as fluorescent thermometer, buried in the dielectric member 1, and fed back to a control portion 8. A heater of the circulator 4 is controlled by the control portion 8 and the temperature of the dielectric member 1 is maintained constant.

Figure 4:
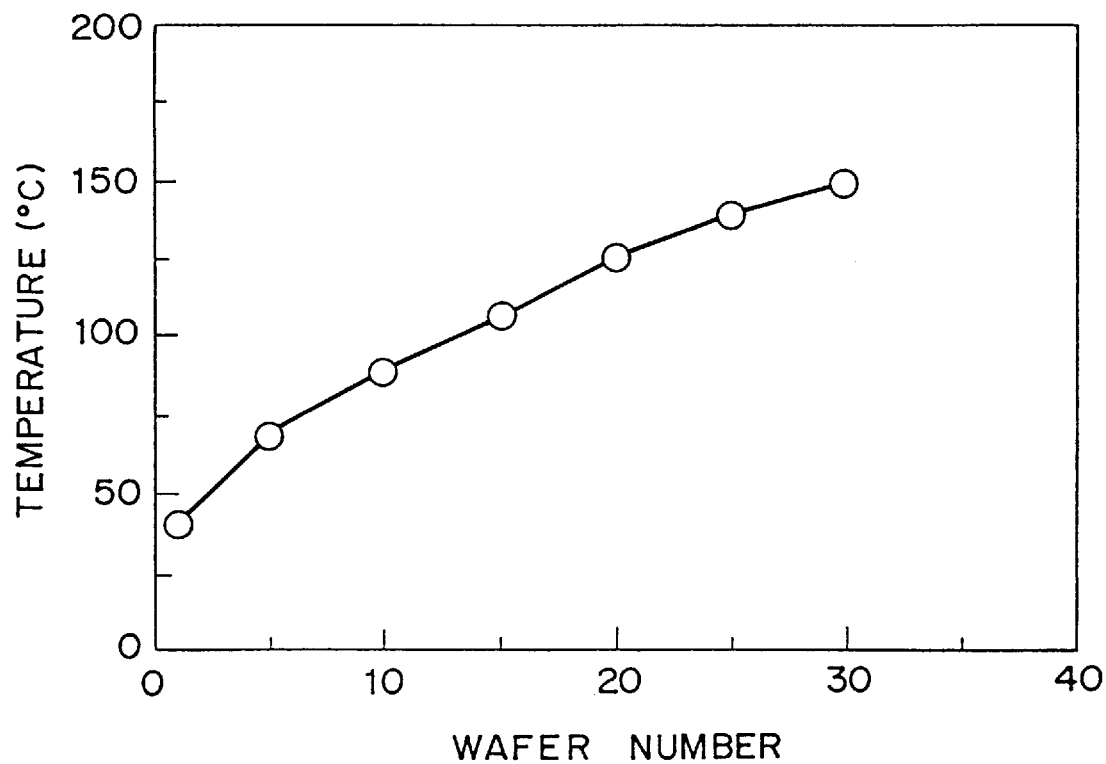
FIG. 4 is a graph, in which the vertical axis represents a temperature of the dielectric member 1, the horizontal axis represents number of wafers processed, and the relation between the two is shown, in the case where temperature control was not performed.

Next, in order to measure how much the temperature of the dielectric member 1 elevates during a continuous etching process, continuous etching was performed without operating the temperature control member including the circulator 4 and temperature of the dielectric member 1 was measured by the temperature measuring element 6. The result is shown in FIG. 4. FIG. 4 is a graph, in which the vertical axis represents the temperature of the dielectric member 1, the horizontal axis represents number of wafers processed, and the relation between the two is shown, in the case where temperature control was not performed. As shown in FIG. 4, in the initial condition where the temperature of the vacuum reaction vessel 2 was 60° C. and the temperature of the lower electrode 7 was 20° C., the temperature of the dielectric member 1 was 40° C. After processing thirty wafers, the temperature of the dielectric member 1 was elevated to about 150° C. On the other hand, a possibility of deposition of the etching reaction product became higher in the order of sequence of the wafer, the dielectric member 1, the vacuum reaction vessel 2 among the wafer, dielectric member 1 and the vacuum reaction vessel 2. Namely, associating with elevating of temperature of the dielectric member 1, the reaction product depositing on the dielectric member 1 was discharged into the plasma, and then possibility of re-deposition on the wafer became highest.

Figure 5A:
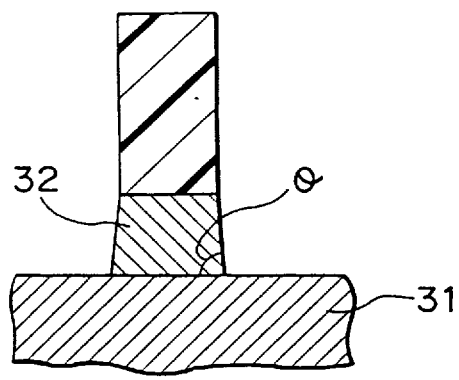
FIG. 5A is a diagrammatic section showing a position of a taper angle.
Figure 5B:
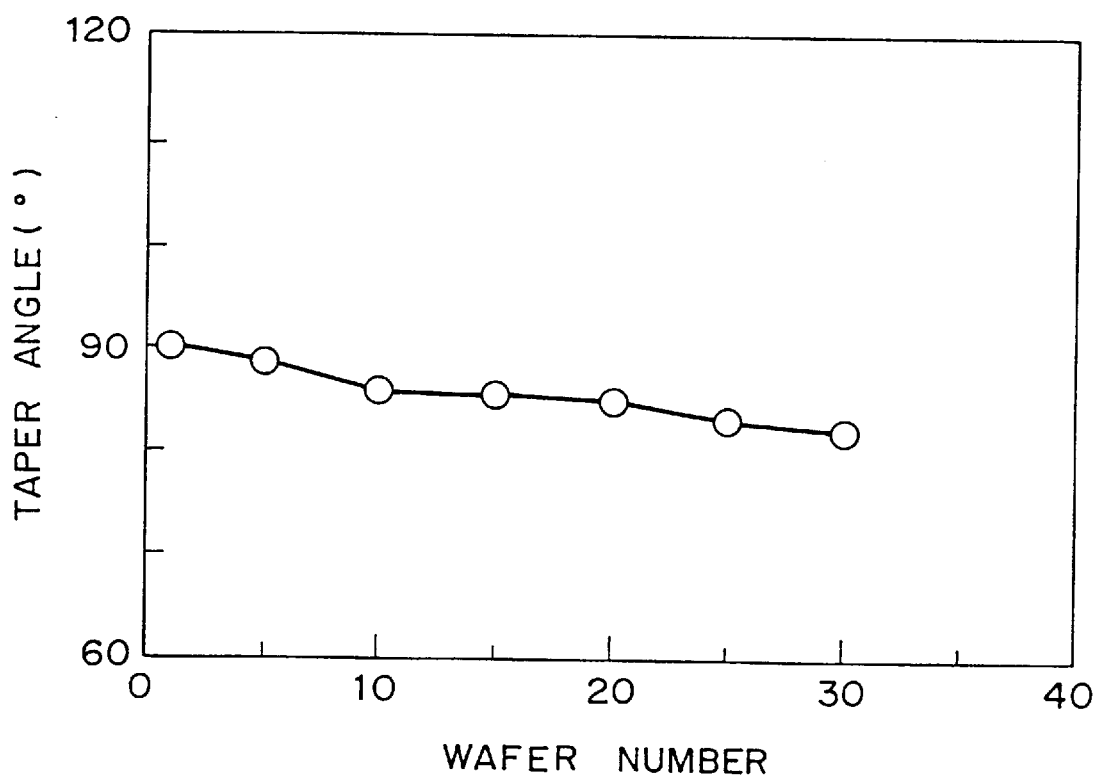
FIG. 5B is a graph, in which the vertical axis represents a taper angle of an etching configuration of a polycrystalline silicon layer, the horizontal axis represents number of wafers processed, and the relation between the two is shown, in the case where temperature control was not performed.

Furthermore, in order to check how deposition of the reaction product on the wafer influences a etching configuration, continuous etching of the polycrystalline silicon layer formed on the surface of the wafer was performed without operating the temperature control member, and a taper angle of the etching configuration was measured. FIG. 5A is a diagrammatic section showing a position of the taper angle. As shown in FIG. 5A, the taper angle θ is an angle in a polycrystalline silicon layer 32 defined by a silicon substrate 31 and the side wall of the polycrystalline silicon layer 32. The result of measurement is shown in FIG. 5B. FIG. 5B is a graph, in which the vertical axis represents the taper angle of the etching configuration of the polycrystalline silicon layer, the horizontal axis represents number of wafers processed, and the relation between the two is shown, in the case where temperature control was not performed. As shown in FIG. 5B, in the initial condition, desired 90° as the taper angle of the polycrystalline silicon layer was able to be obtained. However, after etching process for thirty wafers, anisotropy was degraded to vary the taper angle from 90° to 85° to cause problem in reproducibility.

Figure 6:
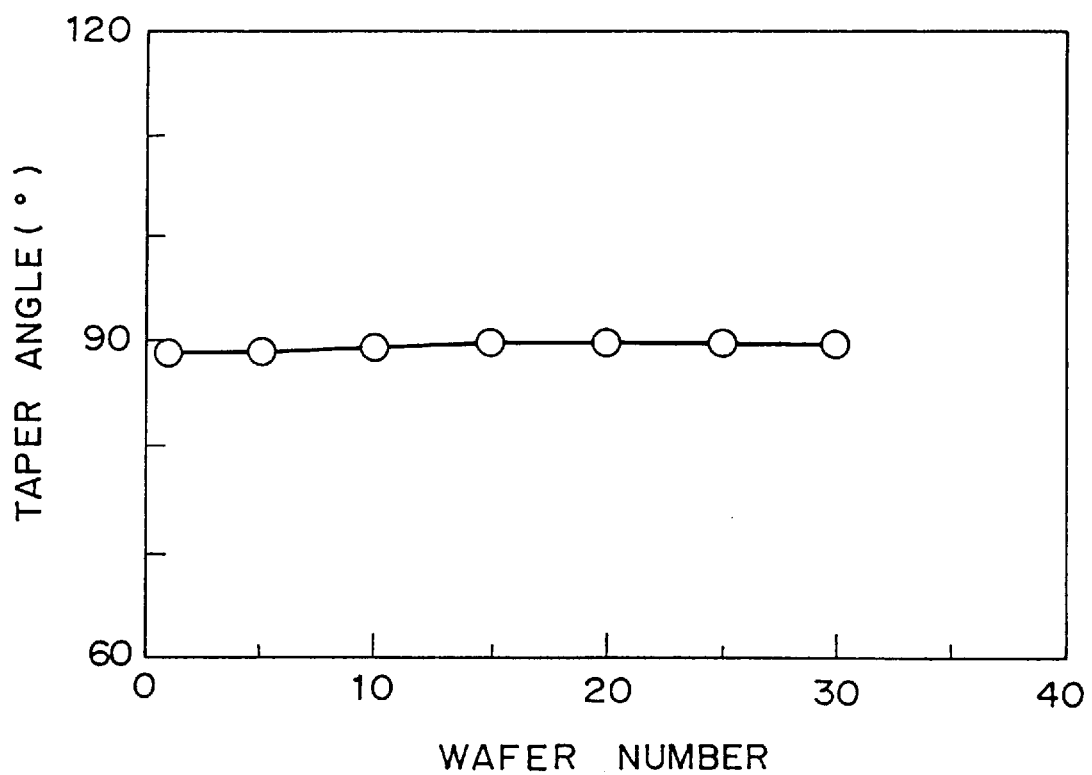
FIG. 6 is a graph, in which the vertical axis represents a taper angle of an etching configuration of a polycrystalline silicon layer, the horizontal axis represents number of wafers processed, and the relation between the two is shown, in the case where temperature control was performed.

Next, in order to check an effect of the temperature control, continuous etching of the polycrystalline silicon formed on the surface of the wafer was performed with operating the temperature control member including the circulator 4. The result is shown in FIG. 6. FIG. 6 is a graph, in which the vertical axis represents the taper angle of the etching configuration of the polycrystalline silicon layer, the horizontal axis represents number of wafers processed, and the relation between the two is shown, in the case where temperature control was performed. As shown in FIG. 6, when the temperature control was performed desired 90° as the taper angle could be obtained even after processing large number of wafers. Etching can be performed with high reproducibility.

Figure 7A:
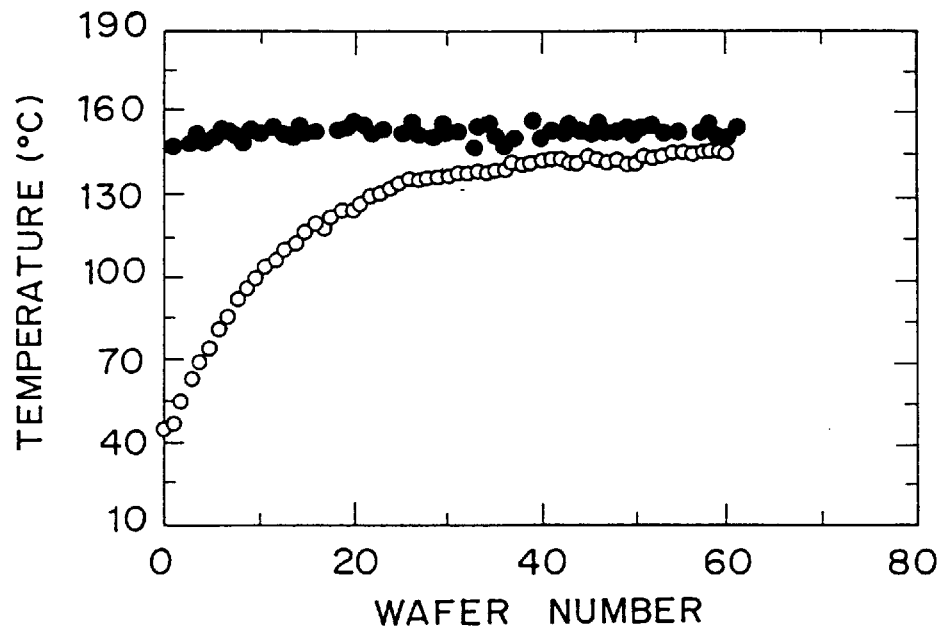
FIG. 7A is a graph, in which the vertical axis represents a taper angle of an etching configuration of a polycrystalline silicon layer, the horizontal axis represents number of wafers processed, and the relation between the two is shown.
Figure 7B:
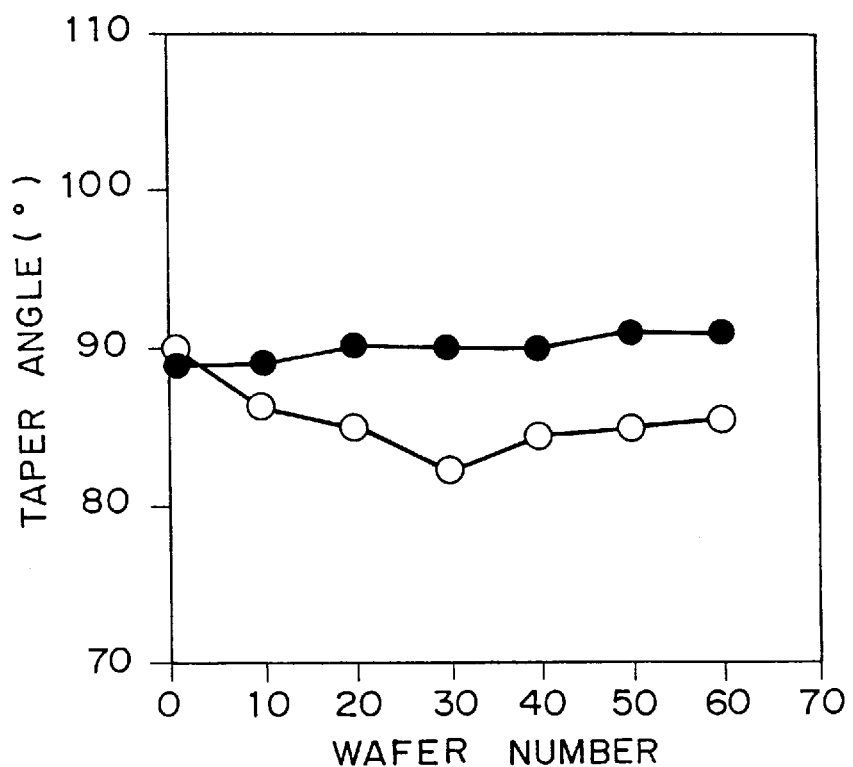
FIG. 7B is a graph, in which the vertical axis represents a taper angle of an etching configuration of a polycrystalline silicon layer, the horizontal axis represents number of wafer processed, and the relation between the two is shown.

For verification of the foregoing results, similar measurement was performed with increasing number of wafers to be processed to sixty. The results are shown in FIGS. 7A and 7B. FIG. 7A is a graph, in which the vertical axis represents the temperature of the etching configuration of the polycrystalline silicon layer, the horizontal axis represents number of wafers processed, and the relation between the two is shown, and FIG. 7B is a graph, in which the vertical axis represents the taper angle of the etching configuration of the polycrystalline silicon layer, the horizontal axis represents number of wafers processed, and the relation between the two is shown. In FIGS. 7A and 7B, white circles (○) represent the case where the temperature control was not performed and black circles (●) represent the case where the temperature control was performed. As shown in FIG. 7A, the temperature of the dielectric member 1 became substantially constant when thirty or more wafers were processed irrespective whether the temperature control was performed or not. Associating therewith, as shown in FIG. 7B, the taper angle became substantially constant even when the temperature control was not performed. On the other hand, as can be appreciated from FIG. 7A that it should be sufficient to set the upper limit of the temperature control range of the dielectric member 1 at about 160° C. Also, in order to determine the lower limit of the temperature control range, similar experiments was performed with maintaining the temperature of the dielectric member 1 at 60° C. Then, the same work effect was obtained.

The temperature setting range of the dielectric member by the temperature control member is preferably set at 160° C. as the upper limit as confirmed in the foregoing inspection, and at about 60° C. as the lower limit in consideration of performance of the circulator and the heat capacity of the vacuum reaction vessel and the lower electrode. In practice, when the lower limit was set to be lower than 60° C., the temperature control member became unstable to cause difficulty in maintaining the temperature constant. Accordingly, it is desirable to maintain the temperature constant within the temperature range of 60° C. to 160° C.. By controlling the temperature within the range of 60° C to 160° C., favorable effect can be provided that deposition of the reaction product generated by etching on the surface inside of the dielectric member is avoided. On the other hand, since the temperature of the dielectric member is controlled at a constant value during continuous etching, the amount of the deposition layer on the dielectric member may not be increased. As a result, contamination of a wafer as a work by the particles can be eliminated and stabilization of the amount of the deposition layer results in improvement of reproducibility of the etching.

Figure 8:
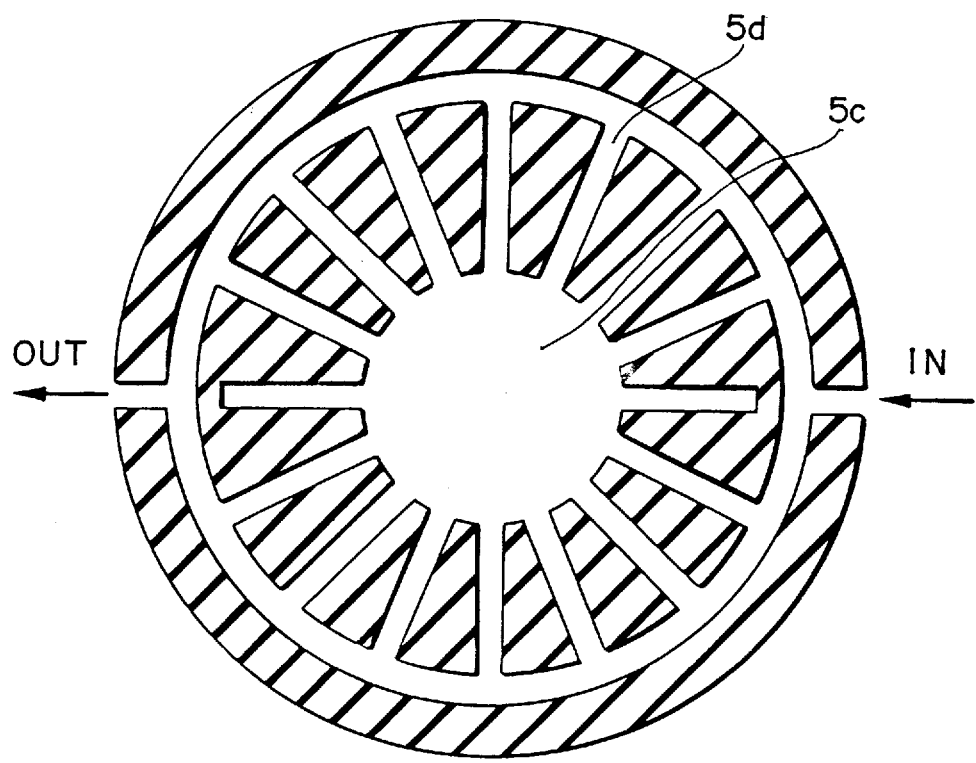
FIG. 8 is a cross section of a dielectric member 1 showing a modification of a flow path 5 shown in FIG. 2.

FIG. 8 is a cross section of the dielectric member 1 showing a modification of the flow path 5 shown in FIG. 2. As shown in FIG. 8, in the dielectric member 1, a flow path 5c having large projection area is provided at the center portion. A plurality of flow paths 5d radially extended from the center portion are provided at positions not directly connected to the inlet/outlet ports of the hot medium. The hot conductive medium flowing through the flow paths 5c and 5d are electrically grounded. Therefore, the induced electric field generated by the high frequency coil is introduced into the vacuum reaction vessel 2 through a portion which is not the flow paths 5c and 5d. Accordingly, at the portion having larger production area of the flow path, namely the portion closer to the center portion, the intensity of the induced electric field becomes lower to make the plasma density smaller.

Figure 9:
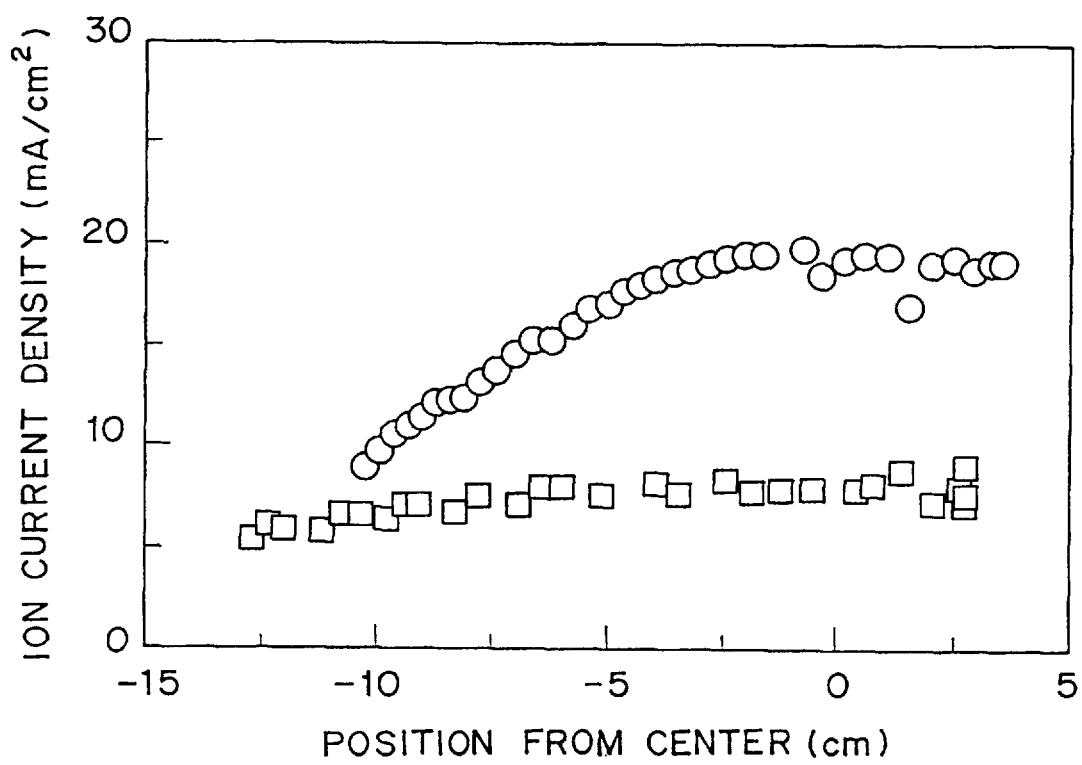
FIG. 9 is a graph, in which the vertical axis represents an ion current density, the horizontal axis represents a position from the center of a vacuum reaction vessel, and the relation between the two is shown, in the case where a conventional dielectric member having uniform thickness and uniform internal structure, or a dielectric member having a flow path shown in FIG. 8 was employed.

Normally, when the inductively coupled plasma is generated by applying the high frequency current to the spiral high frequency coil wound at regular interval in flat form, the plasma density at the center portion of the coil is high. The plasma density is lowered at greater distance from the center portion. FIG. 9 is a graph, in which the vertical axis represents an ion current density, the horizontal axis represents a position from the center of the vacuum reaction vessel, and the relation between the two is shown, in the case where the conventional dielectric member having uniform thickness and a uniform internal structure, or the dielectric member having flow paths shown in FIG. 8 was employed. It should be noted that, in FIG. 9, ○ represents the case where the conventional dielectric member was employed, and □ represents the case where the shown embodiment of the dielectric member was employed. As shown in FIG. 9, when the conventional dielectric member is employed, higher ion current density was able to be obtained. However, the ion density was higher at the center portion and lower at the circumferential portion to degrade uniformity. On the other hand, when the dielectric member having the flow paths shown in FIG. 8 was employed, the induced electric field intensity was restricted at the center portion to lower the overall the ion current density, but quite high uniformity of the ion current density distribution was achieved. As set forth above, by optimizing the configuration of the flow paths within the dielectric member and the projection area occupied by the flow path, uniformity of the plasma density can be achieved.

Figure 10:
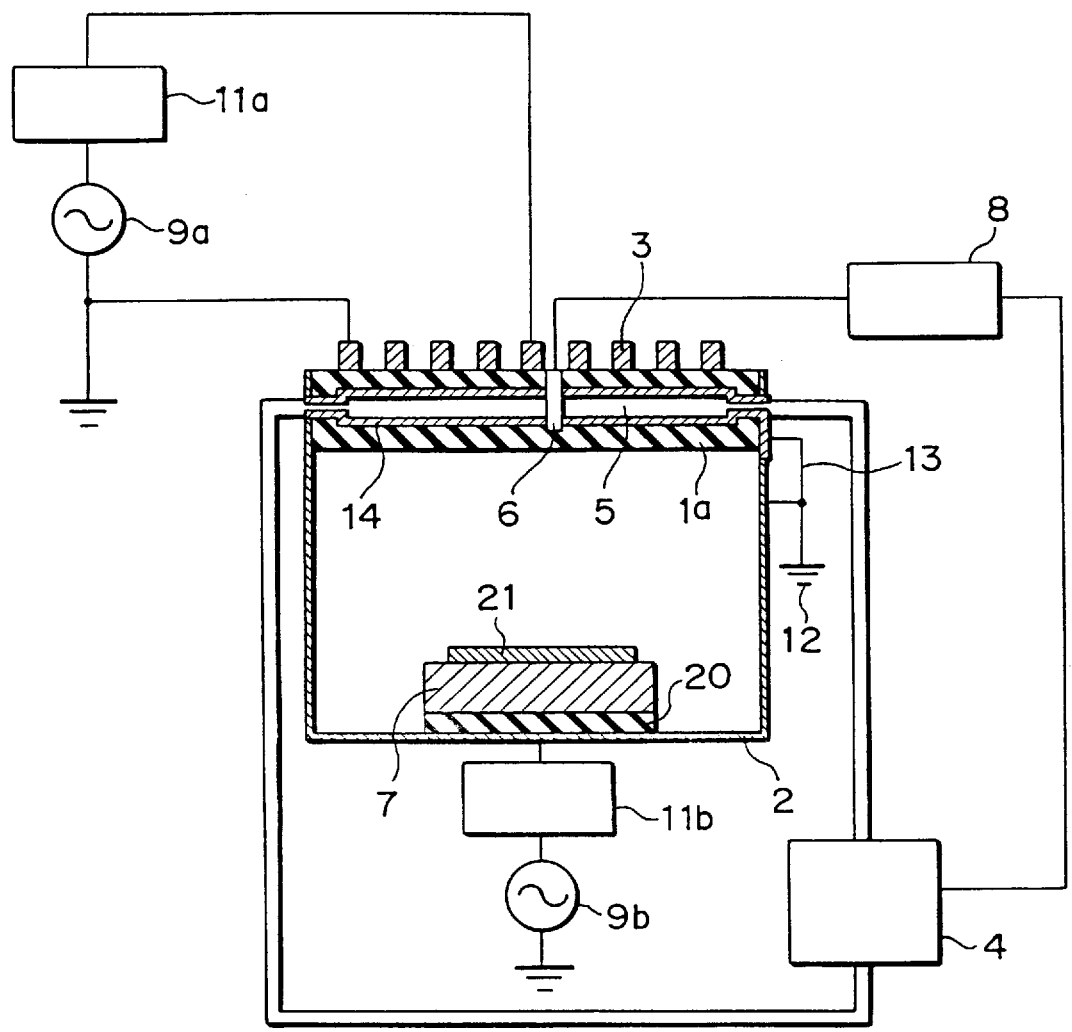
FIG. 10 is a diagrammatic section showing the second embodiment of a plasma processing apparatus according to the present invention.

FIG. 10 is a diagrammatic section showing the second embodiment of the plasma processing apparatus according to the present invention. As shown in FIG. 10, in the shown plasma processing apparatus, the inner wall of the flow path 5 is covered with a conductive member 14. The ground 12 is connected to the conductive member 14 via the conductive line 13. Thus, a hot insulation medium is circulated through the flow path 5. The construction which is not those set forth above is the same as those of the first embodiment of the plasma processing apparatus according to the present invention. In the second embodiment, the flow path 5 is covered with the conductive member 14, and the conductive member 14 is grounded. Therefore, the conductive path having the electromagnetic shield similar to the first embodiment is formed. Thus, by lowering the capacitive coupling between the high frequency coil 3 and the plasma, the problem of discharging of impurity into the plasma from the dielectric member 1a by sputtering to the dielectric member 1a is avoided. Furthermore, by circulating the hot insulation medium, the temperature of the dielectric member 1a can be maintained constant to realize reproducibility of stable etching.

In the first embodiment, the hot conductive medium to be used is limited to the expensive, for example, an acid or alkaline solution having high ion concentration. On the other hand, in the second embodiment, since the hot insulation medium is employed, normal hot medium, such as hot fluorocarbon type medium, pure water and the like which is easy to handle and inexpensive, may be used. Also, even in the second embodiment, similarly to the first embodiment, the configuration and distribution of the hot medium circulating flow path can be modified in any way.

Figure 11:
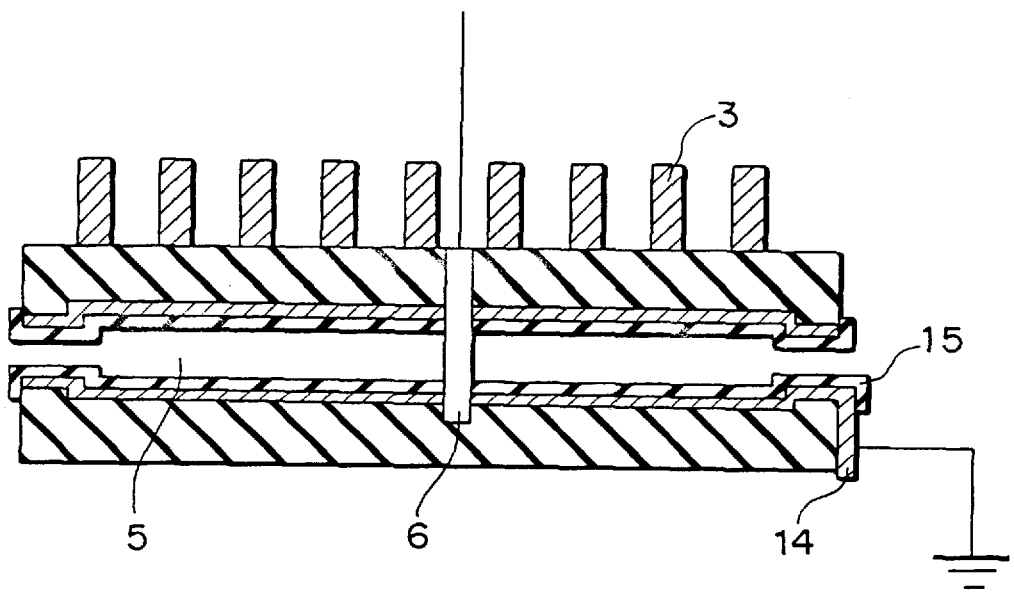
FIG. 11 is a section showing a modification of an upper wall portion of a vacuum reaction vessel shown in FIG. 10.

FIG. 11 is a section showing a modification of the upper wall portion of the vacuum reaction vessel shown in FIG. 10. As shown in FIG. 11, in the shown modification, the upper wall portion of the vacuum reaction vessel is formed by providing an insulation member 15 covering the conductive member 14. Other construction is the same as the second embodiment. As shown in the second embodiment, even when the hot medium of the relatively high temperature is in contact with the conductive member 14, the hot medium may get slight conductivity through long period use to cause electrolytic etching of the conductive member 14. Therefore, the conductive member 14 is covered with the insulation member 15 and the hot insulation medium and the conductive member 14 may not contact so that it can be used stably for a long period.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A plasma processing apparatus comprising:
    a vacuum reaction vessel having a dielectric member at an upper portion thereof, a second portion of said dielectric member being electrically grounded;
    a high frequency coil provided outside of said vacuum reaction vessel at an upper surface of said dielectric member;
    a first high frequency power source supplying a high frequency current to said high frequency coil;
    a first tuning member connected between said high frequency coil and said first high frequency source;
    means for introducing a process gas into said vacuum reaction chamber;
    a lower electrode positioned at a lower part of said vacuum reaction vessel and mounting a work to be processed;
    a second high frequency power source applying a high frequency voltage to said lower electrode;
    a second tuning member connected between said lower electrode and said second high frequency power source;
    a hot fluid circulating device having a plurality of flow paths through which the hot fluid is circulated within the dielectric member and which is located outside of the vacuum reaction vessel;
    means for electrically holding at ground potential one of said hot fluid and said flow paths; and
    a temperature adjusting member for controlling a temperature of said hot fluid and said dielectric member.

2. A plasma processing apparatus as set forth in claim 1, wherein said hot fluid is conductive and said means for electrically holding at ground potential connects a conductive piping in said flow paths to ground.

3. A plasma processing apparatus as set forth in claim 2, wherein said hot conductive fluid comprises a solution selected from a group consisting of an acid solution with high ion concentration and an alkaline solution with high ion concentration.

4. A plasma processing apparatus as set forth in claim 1, wherein said hot fluid is an electrical insulator and said means for electrically holding ground potential has a grounded conductive member provided at the inner wall of said flow paths.

5. A plasma processing apparatus as set forth in claim 4, wherein said conductive member is covered with an insulation member.

6. A plasma processing apparatus as set forth in claim 4, wherein said hot fluid is a liquid selected from a group consisting of hot fluorocarbon and a pure water.

7. A plasma processing apparatus as set forth in claim 1, wherein said flow paths are in coaxial circular form at the center portion of said dielectric member.

8. A plasma processing apparatus as set forth in claim 5, wherein a projection area of said flow paths becomes smaller at a greater distance from the center portion of the dielectric member to an outer periphery.

9. A plasma processing apparatus as set forth in claim 1, wherein the temperature of said dielectric member is controlled within a range between 60° to 160° C.

10. A plasma processing apparatus as set forth in claim 1, wherein said temperature adjusting member comprises a fluorescent thermometer buried within said dielectric member and connected to a control portion and the temperature measured by said fluorescent thermometer is fed back to said control portion to control the temperature of said dielectric member.

11. A plasma processing apparatus, comprising:
    a vacuum reaction chamber having a top portion and a bottom portion;
    a lower electrode for holding a workpiece positioned at the bottom portion of said vacuum reaction chamber;
    a coil positioned on the top portion of said vacuum reaction chamber;
    a dielectric flow path, for circulating a hot conductive fluid, positioned at the top portion of said vacuum reaction chamber beneath said coil; and means for holding the hot conductive fluid to ground potential as to reduce capacitive coupling between said coil and a plasma produced in said vacuum reaction chamber.

12. A plasma processing apparatus as recited in claim 11, further comprising:
    a circulator for circulating the conductive fluid; and
    a temperature sensor positioned in said flow path for measuring a temperature of the conductive fluid, said temperature sensor providing feedback to said circulator to maintain a temperature of said dielectric flow path.

13. A plasma processing apparatus as recited in claim 12, wherein said temperature sensor comprises a flourescent thermometer.

14. A plasma processing apparatus as recited in claim 12 wherein the conductive fluid maintains the dielectric flow path in the range of 60° C. to 160° C.

15. A plasma processing apparatus as recited in claim 11, further comprising:
    a first tuned power source for providing power to said coil; and
    a second tuned power source for providing power to said lower electrode.

16. A plasma processing apparatus as recited in claim 11, wherein said dielectric flow path comprises a plurality of coaxial flow paths.

17. A plasma processing apparatus as recited in claim 11 wherein said flow path comprises a plurality of radial flow paths extending from a center hub.

* * * * *